United States Patent
Inoue et al.

(10) Patent No.: US 8,703,297 B2
(45) Date of Patent: Apr. 22, 2014

(54) CHARGE-PREVENTING OPTICAL FILM, CHARGE-PREVENTING ADHESIVE OPTICAL FILM, MANUFACTURING METHOD THEREOF, AND IMAGE DISPLAY DEVICE

(75) Inventors: Shinichi Inoue, Osaka (JP); Masayuki Satake, Osaka (JP); Toshitsugu Hosokawa, Osaka (JP); Akiko Ogasawara, Osaka (JP); Akira Ootani, Osaka (JP)

(73) Assignee: Nitto Denko Corporation, Osaka (JP)

( * ) Notice: Subject to any disclaimer, the term of this patent is extended or adjusted under 35 U.S.C. 154(b) by 611 days.

(21) Appl. No.: 11/577,690

(22) PCT Filed: Oct. 12, 2005

(86) PCT No.: PCT/JP2005/018767
§ 371 (c)(1),
(2), (4) Date: Apr. 20, 2007

(87) PCT Pub. No.: WO2006/043451
PCT Pub. Date: Apr. 27, 2006

(65) Prior Publication Data
US 2008/0044674 A1    Feb. 21, 2008

(30) Foreign Application Priority Data
Oct. 21, 2004 (JP) .................... 2004-306983

(51) Int. Cl.
| | |
|---|---|
| G02B 1/10 | (2006.01) |
| G02B 5/30 | (2006.01) |
| G02F 1/1335 | (2006.01) |
| G09F 9/00 | (2006.01) |
| H01L 51/50 | (2006.01) |
| H05B 33/02 | (2006.01) |
| H05F 1/00 | (2006.01) |

(52) U.S. Cl.
USPC ........... 428/480; 428/323; 428/327; 428/343; 428/411; 428/704

(58) Field of Classification Search
None
See application file for complete search history.

(56) References Cited

U.S. PATENT DOCUMENTS

| | | |
|---|---|---|
| 4,802,745 A | 2/1989 | Okada et al. |
| 5,300,575 A | 4/1994 | Jonas et al. |

(Continued)

FOREIGN PATENT DOCUMENTS

| | | |
|---|---|---|
| CN | 1171617 | 1/1998 |
| CN | 1188500 | 7/1998 |

(Continued)

OTHER PUBLICATIONS

International Search Report issued on the corresponding PCT Application No. PCT/JP2005/018767, dated Jan. 31, 2006.

(Continued)

*Primary Examiner* — Callie Shosho
*Assistant Examiner* — Cheng Huang
(74) *Attorney, Agent, or Firm* — Knobbe Martens Olson & Bear LLP

(57) ABSTRACT

The present invention aims at providing an antistatic optical film having excellent antistatic effect and high light transmittance, wherein an antistatic layer laminated on at least one side of the optical film. An antistatic optical film having an antistatic layer laminated on at least one side of the optical film, wherein rubbing treatment is performed on a surface of the optical film on which the antistatic layer is laminated, and a conductive polymer in the antistatic layer is aligned.

20 Claims, 1 Drawing Sheet

(56) References Cited

U.S. PATENT DOCUMENTS

| | | | |
|---|---|---|---|
| 5,334,686 A | 8/1994 | Ando et al. | |
| 5,370,981 A * | 12/1994 | Krafft et al. | 430/529 |
| 5,391,472 A | 2/1995 | Muys et al. | |
| 5,401,537 A | 3/1995 | Kochem et al. | |
| 5,700,623 A | 12/1997 | Anderson et al. | |
| 5,773,150 A | 6/1998 | Tong et al. | |
| 5,831,705 A * | 11/1998 | Kaneko et al. | 349/128 |
| 5,880,800 A | 3/1999 | Mikura et al. | |
| 5,993,694 A | 11/1999 | Ito et al. | |
| 6,002,460 A | 12/1999 | Yamamoto | |
| 6,048,587 A | 4/2000 | Estrin | |
| 6,068,794 A | 5/2000 | Kobayashi et al. | |
| 6,124,083 A | 9/2000 | Majumdar et al. | |
| 6,128,061 A | 10/2000 | Lee et al. | |
| 6,140,030 A | 10/2000 | Anderson et al. | |
| 6,197,418 B1 | 3/2001 | Cloots et al. | |
| 6,245,258 B1 * | 6/2001 | Takatori et al. | 252/299.65 |
| 6,310,133 B1 | 10/2001 | Katashima et al. | |
| 6,392,622 B1 * | 5/2002 | Ozawa | 345/92 |
| 6,392,802 B2 * | 5/2002 | Miyatake et al. | 359/487.02 |
| 6,442,654 B1 | 8/2002 | Brock et al. | |
| 6,503,581 B1 | 1/2003 | Shibue et al. | |
| 6,504,587 B1 | 1/2003 | Morishita et al. | |
| 6,582,789 B1 * | 6/2003 | Sumi | 428/40.1 |
| 6,777,070 B1 * | 8/2004 | Murata et al. | 428/323 |
| 6,809,783 B2 | 10/2004 | Noh et al. | |
| 6,914,139 B2 | 7/2005 | Mukunoki et al. | |
| 6,965,418 B2 | 11/2005 | Hara | |
| 7,357,965 B1 | 4/2008 | Tahon et al. | |
| 7,413,766 B2 | 8/2008 | Satake et al. | |
| 2002/0036738 A1 * | 3/2002 | Matsumoto | 349/123 |
| 2003/0008135 A1 | 1/2003 | Kawamura et al. | |
| 2003/0035947 A1 | 2/2003 | Heberger et al. | |
| 2003/0058391 A1 | 3/2003 | Hara | |
| 2003/0102081 A1 | 6/2003 | Hosokawa et al. | |
| 2003/0164477 A1 * | 9/2003 | Zhou et al. | 252/500 |
| 2003/0203192 A1 | 10/2003 | Kiuchi et al. | |
| 2004/0209007 A1 * | 10/2004 | Satake et al. | 428/1.3 |
| 2006/0127606 A1 | 6/2006 | Ogasawara et al. | |
| 2007/0059521 A1 | 3/2007 | Nakamura | |
| 2008/0032096 A1 * | 2/2008 | Bourdelais et al. | 428/156 |
| 2008/0118752 A1 | 5/2008 | Inoue et al. | |
| 2008/0212003 A1 * | 9/2008 | Sata et al. | 349/119 |
| 2008/0274272 A1 | 11/2008 | Satake et al. | |

FOREIGN PATENT DOCUMENTS

| | | |
|---|---|---|
| CN | 1255707 | 6/2000 |
| EP | 246931 | 11/1987 |
| EP | 0564911 A2 * | 3/1993 |
| JP | 62-239108 | 10/1987 |
| JP | 62-276506 | 12/1987 |
| JP | 63-157149 | 6/1988 |
| JP | 2-73307 | 3/1990 |
| JP | 4-124601 | 4/1992 |
| JP | 2636968 | 4/1997 |
| JP | 10-007795 | 1/1998 |
| JP | 10-142593 | 5/1998 |
| JP | 10-212373 | 8/1998 |
| JP | 10-217379 | 8/1998 |
| JP | 10-239521 | 9/1998 |
| JP | 11-91038 | 4/1999 |
| JP | 2001-130179 | 5/2001 |
| JP | 2001-305346 | 10/2001 |
| JP | 2001-318230 | 11/2001 |
| JP | 2002-060736 | 2/2002 |
| JP | 2002-179954 | 6/2002 |
| JP | 2002-180052 | 6/2002 |
| JP | 2002-258047 | 9/2002 |
| JP | 2003-48284 | 2/2003 |
| JP | 2003-080639 | 3/2003 |
| JP | 2003-246874 | 9/2003 |
| JP | 2003-294951 | 10/2003 |
| JP | 2004-82371 | 3/2004 |
| JP | 2004-94012 | 3/2004 |
| JP | 2004-174725 | 6/2004 |
| KR | 10-2001-0098335 | 11/2001 |
| KR | 10-2002-0016549 | 3/2002 |
| KR | 2004-0020085 | 4/2004 |
| TW | 526374 | 4/2003 |
| WO | WO 97/00922 | 1/1997 |
| WO | WO 2004/049021 | 6/2004 |
| WO | WO 2004/068201 | 8/2004 |
| WO | WO 2005/017060 | 2/2005 |

OTHER PUBLICATIONS

File History of the related U.S. Appl. No. 12/032,905, as of Oct. 12, 2010.

File History of the related U.S. Appl. No. 11/577,705, as of Oct. 12, 2010.

Office Action issued in the corresponding Taiwanese patent application No. 094136762, dated Jan. 9, 2013.

* cited by examiner

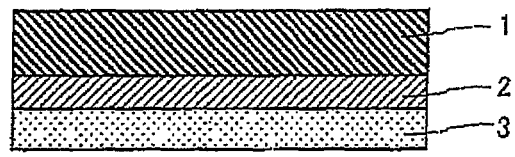

CHARGE-PREVENTING OPTICAL FILM, CHARGE-PREVENTING ADHESIVE OPTICAL FILM, MANUFACTURING METHOD THEREOF, AND IMAGE DISPLAY DEVICE

This application is the U.S. National Phase under 35 U.S.C. §371 of International Application No. PCT/JP2005/018767, filed Oct. 12, 2005, which claims priority to Japanese Patent Application No. 2004-306983, filed Oct. 21, 2004. The International Application was not published in English under PCT Article 21(2).

TECHNICAL FIELD

The present invention relates to an antistatic optical film having an antistatic layer laminated on at least one side of the optical film. The present invention relates to an antistatic pressure-sensitive adhesive optical film having a pressure-sensitive adhesive layer laminated on the antistatic layer of the antistatic optical film.

In liquid crystal displays etc., an image forming system necessarily requires polarizing elements disposed on both sides of a liquid crystal cell, and in general, polarizing plates are adhered thereto. Moreover, in liquid crystal panels, in order to improve display quality of displays, various optical elements in addition to the polarizing plates are increasingly used. For example, retardation plates for prevention of coloring, viewing-angle expansion films for improving viewing angle of liquid crystal displays, and furthermore, brightness enhancement films for increasing contrast of displays etc. are used. These films are generically named and called optical films.

In these optical films, in order to prevent occurrence of damage and contamination to a surface of the optical film in transportation or manufacturing process until it is sent to consumers, surface protective films are usually attached on a surface thereof. The surface protective film is attached from a stage in which the optical film is in a state of single substance, and in some case it is peeled after being attached onto an LCD etc., and furthermore in other cases it is attached again after peeled to a same or another surface protective film. And there have been problems that static electricity generated in case of peeling of the surface protective film may destroy circuits, such as in LCD panels. This static electricity affects array elements in the LCD panel and further affects alignment of the liquid crystal and induces problems of defects. The surface protective film will give the same problems due to friction of the optical films not only in peeling, but in the manufacturing process, or in the use by consumers. In order to solve the problems, there has bee proposed application of antistatic property to optical films, such as polarizing plate. For example, disclosed are optical films with an antistatic layer having a layer provided on the surface of the optical film, and optical films having a transparent conductive layer provided on one side or both sides of the optical films.

When attaching an optical film on a liquid crystal cell, pressure-sensitive adhesives are usually used. Furthermore, in adhesion between optical films and liquid crystal cells or between optical films, each material are usually attached together using pressure-sensitive adhesives in order to reduce loss of light. In such a case, since advantages such as omission of drying step for fixing optical films may be given, generally used is a pressure-sensitive adhesive optical film having a pressure-sensitive adhesive layer beforehand provided on one side of the optical film.

The pressure-sensitive adhesive optical films are cut into a size of a display in use. In the case of handling in use, touch of an edge (cut section) of the pressure-sensitive adhesive optical film by operators and by apparatuses may cause possible lack of the pressure-sensitive adhesive in the touched portion. Attachment of the pressure-sensitive adhesive optical film having such lack of the pressure-sensitive adhesive to the liquid crystal cells fails to provide proper adhesion in the lack portion, and therefore, the portion gives reflection of light, causing possible problems of display defects. In particular, in these days, since narrower edges of displays are needed, even defects created at the edges significantly reduce display quality. Furthermore, when peeling of the film from the panel is necessary due to inclusion of foreign matters, etc., after attachment of the pressure-sensitive adhesive optical film to the liquid crystal panel, avoidance of trouble of residue of the pressure-sensitive adhesive (what is called adhesive residue phenomenon) around the side of the panel, that is, excellent reworkability will be needed.

And it is also proposed to provide antistatic property to the above-described pressure-sensitive adhesive optical films. For example, it is proposed that antistatic property is provided to an antiglare layer by inclusion of electric conductive particles in the antiglare layer on the surface of a polarizing plate simultaneously having a pressure-sensitive adhesive layer on an opposite side (Japanese Patent Application Laid-Open No. 10-239521). However, the method in Japanese Patent Application Laid-Open No. 10-239521 has difficulty in maintenance of physical property as an antiglare layer, and therefore shows limited stability. In providing an antistatic layer to a pressure-sensitive adhesive optical film, in order to cancel poor alignment of the liquid crystal cell caused by application of a voltage that happens within the panel, it is preferred to provide the antistatic layer between the optical film and the pressure-sensitive adhesive layer. Antistatic pressure-sensitive adhesive optical films having an antistatic layer provided between an optical film and a pressure-sensitive adhesive layer has a problem of omission of a pressure-sensitive adhesive and adhesive residue, and a problem of reworkability.

A method of inclusion of conductive substances in a pressure-sensitive adhesive layer is proposed as a method of giving antistatic function to an optical film (Japanese Patent Application Laid-Open No. 2003-294951). However, the method in Japanese Patent Application Laid-Open No. 2003-294951 has difficulty in maintenance of physical property as a pressure-sensitive adhesive layer, therefore shows limited stability.

Furthermore, there is proposed a method for forming an antistatic film with a conductive coating agent including polyethylene dioxythiophene-based conductive polymers, polyaniline-based conductive polymers, or polypyrrole-based conductive polymers (Japanese Patent Application Laid-Open No. 2002-179954). However, the method has a problem that formation of the antistatic film using the conductive polymers reduces light transmittance of the antistatic optical film.

SUMMARY OF THE INVENTION

The present invention aims at providing an antistatic optical film having excellent antistatic effect and high light transmittance, wherein an antistatic layer laminated on at least one side of the optical film. Furthermore, the present invention aims at providing an antistatic pressure-sensitive adhesive optical film, which does not easily cause omission of the pressure-sensitive adhesive and exhibits excellent reworkability in addition to the effect described above. Moreover, the present invention also aims at providing an image viewing display using the antistatic optical film.

As a result of repeated wholehearted investigation performed by the present inventors for solving the problem, it has been found out that the problem may be solved by the following antistatic optical film and the following antistatic pressure-sensitive adhesive optical film, leading to completion of the present invention.

That is, the present invention relates to an antistatic optical film having an antistatic layer laminated on at least one side of the optical film, wherein rubbing treatment is performed on a surface of the optical film on which the antistatic layer is laminated and a conductive polymer in the antistatic layer is aligned.

The present inventors have found out that formation of an antistatic layer including at least a conductive polymer on a surface of an optical film on which rubbing treatment has been performed beforehand aligns the conductive polymer (and a binder component) in a fixed direction, thereby effectively suppressing the absorption of light.

In the antistatic optical film of the present invention, the optical film has optical anisotropy, and the rubbing treatment is preferably performed at a rubbing angle of ±10° C. or less with respect to a slow axis, more preferably ±5° C. or less, and especially preferably 0° C. The rubbing angle of ±10° C. or less with respect to the slow axis can more effectively suppress absorption of light. The reason of such an effect is probably that the rubbing treatment performed in the direction of the slow axis of the optical film can align the conductive polymer (and binder component) in the antistatic layer parallel to the slow axis and, can reduce absorption, by the conductive polymer (and binder component), of the light that has transmitted through the optical film.

The present invention also relates to an antistatic optical film having an antistatic layer laminated on at least one side of the optical film, wherein the rubbing treatment is performed on the surface of the antistatic layer, and the conductive polymer in the antistatic layer is in an aligned state.

The rubbing treatment performed on the surface after formation of the antistatic layer can control the alignment of the conductive polymer (and binder component), and thereby, can effectively suppress the absorption of light. As a result, it can also suppress drop of light transmittance of the optical film.

In the antistatic optical film, the conductive polymer is preferably water soluble or water dispersible. In particular, the water soluble or water dispersible conductive polymer is preferably made of polythiophene conductive polymers.

Furthermore in the antistatic optical film, the antistatic layer preferably includes binder components. In particular, the binder component is preferably at least one kind selected from the group consisting of polyurethane-based resins, polyester-based resins, and acryl-based resins.

Furthermore, the present invention relates to an antistatic pressure-sensitive adhesive optical film, wherein a pressure-sensitive adhesive layer is laminated on the antistatic layer of the antistatic optical film.

The present inventors have understood that omission of the pressure-sensitive adhesive and an adhesive residue in reworking from a liquid crystal panel are mainly caused by deterioration of adhesion between the optical film and the pressure-sensitive adhesive layer due to the antistatic layer formed therein. In particular, for this reason, use of a water soluble or water dispersible conductive polymer (and binder component) as an antistatic layer can improve the adhesion between the antistatic layer and the pressure-sensitive adhesive layer. Thereby, the omission, caused by contact of the film end, of some of the pressure-sensitive adhesives in handling of the antistatic pressure-sensitive adhesive optical film, and the adhesive residue at the time of reworking from the liquid crystal panel can be greatly reduced, leading to improvement in the handling property of the antistatic pressure-sensitive adhesive optical film. Furthermore, since the antistatic layer is formed between the optical film and the pressure-sensitive adhesive layer, excellent antistatic effect will be exhibited, and generation of static electricity caused by peeling of the surface protection film or by friction of the optical film may be suppressed, resulting in prevention of breakage of circuits, or alignment defect of the liquid crystal. Furthermore, both of the optical film and the pressure-sensitive adhesive layer can maintain respective physical properties, and can exhibit excellent stability.

In the antistatic pressure-sensitive adhesive optical film, the pressure-sensitive adhesive layer is preferably formed of an acryl-based pressure-sensitive adhesive.

The present invention also relates to a method for producing the antistatic optical film, comprising the steps of: performing rubbing treatment on a surface of the optical film on which an antistatic layer is formed; applying an application liquid containing a conductive polymer to the surface of the optical film on which the rubbing treatment is performed and drying the optical film to form an antistatic layer.

The present invention also relates to a method for producing the antistatic optical film, comprising the steps of: applying an application liquid containing a conductive polymer to at least one side of the optical film, and drying the optical film to form an antistatic layer; and performing rubbing treatment on a surface of the antistatic layer.

Furthermore, the present invention relates to a method for producing the antistatic pressure-sensitive adhesive optical film, comprising the steps of: performing rubbing treatment on a surface of the optical film on which an antistatic layer is formed; applying an application liquid containing a conductive polymer to the surface of the optical film on which the rubbing treatment is performed and drying the optical film to form an antistatic layer; and forming a pressure-sensitive adhesive layer on the antistatic layer.

Furthermore, the present invention relates to a method for producing the antistatic pressure-sensitive adhesive optical film, comprising the steps of: applying an application liquid containing a conductive polymer to at least one side of the optical film, and drying the optical film to form an antistatic layer; performing rubbing treatment on a surface of the antistatic layer; and forming a pressure-sensitive adhesive layer on the antistatic layer on which the rubbing treatment is performed.

Transparent conductive layers have been conventionally formed, using a vacuum deposition method, sputtering method, or an ion-plating method as a method for forming antistatic layers on a surface of optical films, but these methods had higher manufacturing costs and poorer productivity. The method of the present invention can form antistatic layers by application methods, such as a coating method, and can exhibit excellent productivity.

The present invention relates to an image viewing display that uses at least one sheet of the antistatic optical film or the antistatic pressure-sensitive adhesive optical film. In use of the antistatic optical film or the antistatic pressure-sensitive adhesive optical film of the present invention, one of the film may be used independently or two or more of the films may be used in combination according to various kinds of use of the image viewing displays, such as liquid crystal viewing displays.

BRIEF DESCRIPTION OF THE DRAWING

FIG. 1 illustrates an example of a cross section of an antistatic pressure-sensitive adhesive optical film of the present invention.

DESCRIPTION OF THE PREFERRED EMBODIMENT

As illustrated in FIG. 1, in an antistatic pressure-sensitive adhesive optical film of the present invention, an antistatic layer 2 and a pressure-sensitive adhesive layer 3 are laminated on one side of an optical film 1 in this order. In FIG. 1, the pressure-sensitive adhesive layer 3 is formed on one side of the optical film 1, however, the pressure-sensitive adhesive layer 3 may be formed on both sides of the optical film. In addition, the pressure-sensitive adhesive layer 3 on another side may have an antistatic layer 2. The antistatic optical film of the present invention is a film without the pressure-sensitive adhesive layer 3 in FIG. 1.

The antistatic layer 2 of the antistatic pressure-sensitive adhesive optical film according to the present invention includes a conductive polymer that is an antistatic agent.

Conductive polymers having excellent optical properties, external appearance and antistatic effect, and having excellent stability of the antistatic effect in a heated condition and in a humidified condition are used as conductive polymers. Such conductive polymers include polymers, such as polyaniline, polythiophene, polypyrrole, and polyquinoxaline. Of these polymers, polyaniline, polythiophene, etc. that easily become water-soluble conductive polymers or water dispersible conductive polymers are preferably used. In particular, polythiophene is preferred.

Use of the water soluble conductive polymer or water dispersible conductive polymer allows preparation of an application liquid in forming an antistatic layer as an aqueous solution or a water dispersion, and can not require use of organic solvents in the application liquid, and thereby can suppress deterioration and degradation of base materials of the optical film caused by the organic solvents. It is preferred, from the point of adhesion, to use only water as solvents for the aqueous solution or water dispersion, but hydrophilic solvents may also be included. The hydrophilic solvents include, for example, alcohols, such as methanol, ethanol, n-propanol, isopropanol, n-butanol, isobutanol, sec-butanol, tert-butanol, n-amyl alcohol, isoamyl alcohol, sec-amyl alcohol, tert-amyl alcohol, 1-ethyl-1-propanol, 2-methyl-1-butanol, n-hexanol, cyclohexanol, etc.

The weight average molecular weight expressed in terms of polystyrene of the water soluble or water dispersible polyaniline is preferably 500000 or less, and more preferably 300000 or less. The weight average molecular weight expressed in terms of polystyrene of the water soluble or water dispersible polythiophene is preferably 400000 or less, and more preferably 300000 or less. The weight average molecular weight exceeding the value cannot likely satisfy the water solubility or water dispersibility. Preparation of the application liquid (aqueous solution or water dispersion) by use of such polymer tends to make solid content of polymer remain in the application liquid, or to give the application liquid having a higher viscosity, leading to difficulty of formation of an antistatic layer with a uniform thickness.

The water solubility of the water soluble electric conductive polymer represents a water solubility having 5 g or more of solubility to 100 g of water. The solubility of the electric conductive polymer to 100 g of water is preferably 20 to 30 g. The water dispersible conductive polymer is a polymer that allows dispersion of conductive polymers, such as polyaniline and polythiophene in a particle-shaped state in water, and the water dispersion has a lower viscosity of liquid, can provide easy formation of a thinner film, and further enables a uniform applied layer. Here, from the view point of the uniformity of the antistatic layer, the size of 1 µm or less of the particles is preferred.

Furthermore, it is preferred that the water soluble conductive polymer or water dispersible conductive polymer, such as polyaniline and polythiophene as described above, have hydrophilic functional group in the molecule thereof. The hydrophilic functional groups include, for example, a sulfone group, amino group, amido group, imino group, quaternary-ammonium-salt group, hydroxyl group, mercapto group, hydrazino group, carboxyl group, sulfate group, phosphoric ester group, or salts of the above-mentioned groups, etc. Inclusion of the hydrophilic functional group in the molecule improves solubility to water, or allows easy dispersion in a particle shape in water, leading to easier preparation of the water soluble conductive polymer or water dispersible conductive polymer.

As examples of commercially available water soluble conductive polymers, a polyaniline sulfonic acid (manufactured by Mitsubishi Rayon Co., Ltd., weight average molecular weight expressed in terms of polystyrene 150000) etc. may be mentioned. As examples of commercially available water dispersible conductive polymers, a polythiophene based conductive polymer (manufactured by Nagase Chemtech Co., Ltd., trade name, Denatron series) etc. may be mentioned.

Furthermore, in materials for formation of the antistatic layer, a binder component is preferably used in combination with the conductive polymer for improvement in film-forming property of the antistatic agent and in adhesion to the optical film. Since the antistatic agent is a water soluble conductive polymer or a water dispersible conductive polymer, i.e., an aqueous material, a water soluble or water dispersible binder component is preferably used. The binder components include, for example, polyurethane-based resins, polyester-based resins, acryl-based resins, polyether-based resins, cellulose-based resins, polyvinyl alcohol-based resins, epoxy resins, polyvinyl pyrrolidones, polystyrene-based resins, polyethylene glycol, pentaerythritol, etc. Polyurethane-based resins, polyester-based resins, and acryl-based resins are especially preferred. These binder components may be suitably used independently, and two or more kinds may be used in combination according to usages. The amount of the binder component to be used is dependent on kinds of the conductive polymer, and 0.1 to 100 parts by weight of the conductive polymer with respect to 100 parts by weight of the binder component is usually used, and 1 to 50 parts by weight is more preferably used.

The surface electric resistance value of the antistatic layer is preferably $1 \times 10^{12}$ Ω/square or less, more preferably $1 \times 10^{10}$ Ω/square or less, and especially preferably $1 \times 10^{9}$ Ω/square or less. The surface electric resistance value exceeding $1 \times 10^{12}$ Ω/square cannot exhibit sufficient antistatic function. Therefore, it causes peeling of the surface protective film, generates static electricity by friction of the optical film, and possibly causes electrification to induce breakage of circuits of the liquid crystal cell and alignment defect of the liquid crystal.

The pressure-sensitive adhesive for forming the pressure-sensitive adhesive layer 3 of the antistatic pressure-sensitive adhesive optical film according to the present invention is not in particular limited, and, for example, polymers including, as a base polymer, polymers such as an acryl-based polymer, silicone-based polymer, polyester, polyurethane, polyamide, polyether, fluorine-based polymer, rubber-based polymer and the like may be suitably selected to be used. In particular, polymers having excellent optical transparency, weather resistance and heat-resisting property, and exhibiting suitable pressure-sensitive adhesive properties such as wettability, cohesiveness, and adherability may be preferably used. Acrylic pressure-sensitive adhesives are preferably used as polymers exhibiting such special features.

For the acryl-based pressure-sensitive adhesive, acryl-based polymer having a monomer unit of an alkyl(meth)acrylate as a main skeleton is used as abase polymer. In addition, a term (meth)acrylate, as used herein, represents acrylate and/or methacrylate and represents the same meaning as (meth) used in the present invention. The average carbon number of the alkyl group of the alkyl(meth)acrylate constituting the main skeleton of the acryl-based polymer is about 1 to 12. Examples of the alkyl(meth)acrylate include methyl(meth)acrylate, ethyl(meth)acrylate, butyl(meth)acrylate, 2-ethylhexyl(meth)acrylate, etc., and they may be used independently or may be used in combination. Among these, alkyl(meth)acrylate including an alkyl group having 1 to 9 carbon atoms is preferred.

For improvement of adherability and heat-resisting property, one or more kinds of various monomers may be introduced into the acryl-based polymer by copolymerization. Examples of such monomers for copolymerization include, for example, monomers containing a hydroxyl group, such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, (4-hydroxymethylcyclohexyl)-methyl acrylate, etc.; monomers containing a carboxyl group such as (meth)acryl-based acid, carboxyethyl(meth)acrylate, carboxypentyl(meth)acrylate, itaconic acid, maleic acid, fumaric acid, crotonic acid, etc.; monomers containing an acid anhydride group, such as maleic anhydride and itaconic acid anhydride; caprolactone additive of acrylic acid; monomers containing a sulfonic acid group, such as styrene sulfonic acid, allylsulfonic acid, sulfopropyl(meth)acrylate, (meth)acryloyloxy naphthalenesulfonic acid, etc.; monomers containing a phosphoric acid group, such as 2-hydroxyethyl acryloyl phosphate, etc.

Examples of monomers for modification include, for example, (meth)acrylamide; (N-substituted) amido-based monomers such as N,N-dimethyl(meth)acrylamide, N-butyl (meth)acrylamide, N-methylol(meth)acrylamide, N-methylolpropane(meth)acrylamide, etc.; alkylamino alkyl(meth)acrylate-based monomers such as aminoethyl(meth)acrylate, N,N-dimethylaminoethyl(meth)acrylate, t-butylamino ethyl (meth)acrylate, etc.; alkoxyalkyl(meth)acrylate monomers such as methoxyethyl(meth)acrylate, ethoxyethyl(meth)acrylate, etc.; succinimide-based monomers such as N-(meth)acryloyloxy methylenesuccinimide, N-(meth)acryloyl-6-oxyhexamethylene succinimide, N-(meth)acryloyl-8-oxyoctamethylene succinimide, N-acryloyl morpholine etc.

Furthermore, there may be used vinyl-based monomers such as vinyl acetate, vinyl propionate, N-vinyl pyrrolidone, methylvinyl pyrrolidone, vinylpyridine, vinyl piperidone, vinyl pyrimidine, vinyl piperazine, vinyl pyrazine, vinyl pyrrole, vinyl imidazole, vinyl oxazol, vinyl morpholine, and N-vinyl carboxylic amides, styrene, α-methyl styrene, N-vinylcaprolactam, etc.; cyanoacrylate-based monomers such as acrylonitrile and methacrylonitrile; acryl-based monomers containing epoxy groups, such as glycidyl(meth)acrylate; glycol acrylate-based monomers such as polyethyleneglycol (meth)acrylate, polypropyleneglycol(meth)acrylate, methoxyethyleneglycol(meth)acrylate, methoxypolypropyleneglycol(meth)acrylate, etc.; acrylate-based monomers such as tetrahydrofurfuryl(meth)acrylate, fluorinated (meth)acrylate, silicone(meth)acrylate, 2-methoxyethyl acrylate, etc.

Of these polymers, in view of adherability to liquid crystal cells and adhesive durability as optical film usages, monomers containing a carboxyl group, such as acrylic acid, are preferably used.

The proportion of the copolymerization monomer in the acryl-based polymer is not in particular limited, and it is preferably approximately 0.1 to 10% in weight ratio.

An average molecular weight of the acryl-based polymer is not especially limited, and the weight average molecular weight is preferably approximately 300000 to 2500000. The acryl-based polymer may be produced by various publicly known methods, and for example radical-polymerization methods, such as bulk polymerization method, solution-polymerization method, and suspension-polymerization method, may be suitably selected. As radical polymerization initiators, various kinds of publicly known initiators, such as an azo-based and peroxide-based initiator, may be used. Reaction temperature is usually approximately 50 to 80° C., and reaction period is 1 to 8 hours. Furthermore, of the manufacturing methods, the solution-polymerization method is preferred and, generally ethyl acetate, toluene, etc. are used as a solvent. The solution concentration is usually approximately 20 to 80% by weight.

Examples of base polymers of rubber based pressure-sensitive adhesives include, for example, natural rubbers, isoprene-based rubbers, styrene-based butadiene rubbers, regenerated rubbers, polyisobutylene-based rubbers, styrene isoprene styrene-based rubbers, styrene butadiene styrene-based rubbers, etc. Examples of base polymers of silicone-based pressure-sensitive adhesives include, for example, dimethylpolysiloxane, diphenylpolysiloxane, etc. Base polymer shaving functional groups, such as a carboxyl group, introduced therein may also be used.

The pressure-sensitive adhesive is preferably a pressure-sensitive adhesive composition including cross linking agents. Multifunctional compounds that can be blended with the pressure-sensitive adhesive include organic cross linking agents and polyfunctional metal chelates. The organic cross linking agents include epoxy-based cross linking agents, isocyanate-based cross linking agents, imine-based cross linking agents, etc. As organic cross linking agents, isocyanate-based cross linking agents are preferred. Polyfunctional metal chelates are obtained by covalent bonding or coordinate bonding polyvalent metals with organic compounds. The polyvalent metal atoms include Al, Cr, Zr, Co, Cu, Fe, Ni, V, Zn, In, Ca, Mg, Mn, Y, Ce, Sr, Ba, Mo, La, Sn, Ti, etc. Atoms in the organic compounds capable of covalent bonding or coordinate bonding include an oxygen atom, etc., and the organic compounds include alkyl esters, alcohol compounds, carboxylic acid compounds, ether compounds, ketone compounds, etc.

The proportion of blending of the base polymer such as acryl-based polymer, etc and the cross linking agent is not in particular limited, and the cross linking agent (solid content) is preferably approximately 0.01 to 10 parts by weight with respect to 100 parts by weight of the base polymer (solid content), and more preferably approximately 0.1 to 5 parts by weight.

Furthermore, various kinds of additives such as tackifiers, plasticizers, fillers including glass fibers, glass beads, metal powders, other inorganic powders, pigments, colorants, fillers, antioxidants, ultraviolet absorbers, silane coupling agents, etc. may also be suitably used as the pressure-sensitive adhesive, if needed, in the range that does not depart from objects of the present invention. The pressure-sensitive adhesive may also be used as a pressure-sensitive adhesive layer exhibiting light diffusibility by inclusion of particles.

As optical film 1 used for the antistatic pressure-sensitive adhesive optical film of the present invention, optical films used for formation of image viewing displays, such as liquid crystal viewing displays, may be used, and the kind is not limited in particular. For example, polarizing plates may be illustrated as the optical films. Polarizing plates having a transparent protective film one side or both sides of a polarizer is generally used.

A polarizer is not limited especially but various kinds of polarizer may be used. As a polarizer, for example, a film that is uniaxially stretched after having dichromatic substances, such as iodine and dichromatic dye, absorbed to hydrophilic high molecular weight polymer films, such as polyvinyl alcohol type film, partially formalized polyvinyl alcohol type film, and ethylene-vinyl acetate copolymer type partially saponified film; poly-ene type orientation films, such as dehydrated polyvinyl alcohol and dehydrochlorinated polyvinyl chloride, etc. may be mentioned. In these, a polyvinyl alcohol type film on which dichromatic materials (iodine, dyes) is absorbed and oriented after stretched is suitably used. Although thickness of polarizer is not especially limited, the thickness of about 5 to 80 μm is commonly adopted.

A polarizer that is uniaxially stretched after a polyvinyl alcohol type film dyed with iodine is obtained by stretching a polyvinyl alcohol film by 3 to 7 times the original length, after dipped and dyed in aqueous solution of iodine. If needed the film may also be dipped in aqueous solutions, such as boric acid and potassium iodide, which may include zinc sulfate, zinc chloride. Furthermore, before dyeing, the polyvinyl alcohol type film may be dipped in water and rinsed if needed. By rinsing polyvinyl alcohol type film with water, effect of preventing un-uniformity, such as unevenness of dyeing, is expected by making polyvinyl alcohol type film swelled in addition that also soils and blocking inhibitors on the polyvinyl alcohol type film surface may be washed off. Stretching may be applied after dyed with iodine or may be applied concurrently, or conversely dyeing with iodine may be applied after stretching. Stretching is applicable in aqueous solutions, such as boric acid and potassium iodide, and in water bath.

As the protective film prepared on one side or both sides of the polarizer, materials is excellent in transparency, mechanical strength, heat stability, water shielding property, isotropy, etc. may be preferably used. As materials of the above-mentioned protective layer, for example, polyester type polymers, such as polyethylene terephthalate and polyethylenenaphthalate; cellulose type polymers, such as diacetyl cellulose and triacetyl cellulose; acrylics type polymer, such as poly methylmethacrylate; styrene type polymers, such as polystyrene and acrylonitrile-styrene copolymer (AS resin); polycarbonate type polymer may be mentioned. Besides, as examples of the polymer forming a protective film, polyolefin type polymers, such as polyethylene, polypropylene, polyolefin that has cyclo-type or norbornene structure, ethylene-propylene copolymer; vinyl chloride type polymer; amide type polymers, such as nylon and aromatic polyamide; imide type polymers; sulfone type polymers; polyether sulfone type polymers; polyether-ether ketone type polymers; poly phenylene sulfide type polymers; vinyl alcohol type polymer; vinylidene chloride type polymers; vinyl butyral type polymers; allylate type polymers; polyoxymethylene type polymers; epoxy type polymers; or blend polymers of the above-mentioned polymers may be mentioned. Films made of heat curing type or ultraviolet ray curing type resins, such as acryl based, urethane based, acryl urethane based, epoxy based, and silicone based, etc. may be mentioned.

Moreover, as is described in Japanese Patent Laid-Open Publication No. 2001-343529 (WO01/37007), polymer films, for example, resin compositions including (A) thermoplastic resins having substituted and/or non-substituted imido group is in side chain, and (B) thermoplastic resins having substituted and/or non-substituted phenyl and nitrile group in side chain may be mentioned. As an illustrative example, a film may be mentioned that is made of a resin composition including alternating copolymer comprising iso-butylene and N-methyl maleimide, and acrylonitrile-styrene copolymer. A film comprising mixture extruded article of resin compositions etc. may be used.

In general, a thickness of the protection film, which can be determined arbitrarily, is 1 through 500 μm, preferably 5 through 200 μm in viewpoint of strength, work handling and thin layer.

Moreover, it is preferable that the protective film may have as little coloring as possible. Accordingly, a protective film having a phase difference value in a film thickness direction represented by $Rth=[(nx+ny)/2-nz] \times d$ of −90 nm through +75 nm (where, nx and ny represent principal indices of refraction in a film plane, nz represents refractive index in a film thickness direction, and d represents a film thickness) may be preferably used. Thus, coloring (optical coloring) of polarizing plate resulting from a protective film may mostly be cancelled using a protective film having a phase difference value (Rth) of −90 nm through +75 nm in a thickness direction. The phase difference value (Rth) in a thickness direction is preferably −80 nm through +60 nm, and especially preferably −70 nm through +45 nm.

As a protective film, if polarization property and durability are taken into consideration, cellulose based polymer, such as triacetyl cellulose, is preferable, and especially triacetyl cellulose film is suitable. In addition, when the protective films are provided on both sides of the polarizer, the protective films comprising same polymer material may be used on both of a front side and a back side, and the protective films comprising different polymer materials etc. may be used. Adhesives are used for adhesion processing of the above described polarizer and the protective film. As adhesives, isocyanate derived adhesives, polyvinyl alcohol derived adhesives, gelatin derived adhesives, vinyl polymers derived latex type, aqueous polyurethane based adhesives, aqueous polyesters derived adhesives, etc. may be mentioned.

A hard coat layer may be prepared, or antireflection processing, processing aiming at sticking prevention, diffusion or anti glare may be performed onto the face on which the polarizing film of the above described protective film has not been adhered.

A hard coat processing is applied for the purpose of protecting the surface of the polarizing plate from damage, and this hard coat film may be formed by a method in which, for example, a curable coated film with excellent hardness, slide property etc. is added on the surface of the protective film using suitable ultraviolet curable type resins, such as acrylic type and silicone type resins. Antireflection processing is applied for the purpose of antireflection of outdoor daylight on the surface of a polarizing plate and it may be prepared by forming an antireflection film according to the conventional method etc. Besides, a sticking prevention processing is applied for the purpose of adherence prevention with adjoining layer.

In addition, an anti glare processing is applied in order to prevent a disadvantage that outdoor daylight reflects on the surface of a polarizing plate to disturb visual recognition of transmitting light through the polarizing plate, and the processing may be applied, for example, by giving a fine concavo-convex structure to a surface of the protective film using, for example, a suitable method, such as rough surfacing treatment method by sandblasting or embossing and a method of combining transparent fine particle. As a fine particle combined in order to form a fine concavo-convex structure on the above-mentioned surface, transparent fine particles whose average particle size is 0.5 to 50 μm, for example, such as inorganic type fine particles that may have conductivity comprising silica, alumina, titania, zirconia, tin oxides, indium oxides, cadmium oxides, antimony oxides, etc., and organic type fine particles comprising cross-linked of non-cross-linked polymers may be used. When forming fine concavo-convex structure on the surface, the amount of fine particle used is usually about 2 to 50 weight part to the transparent resin 100 weight part that forms the fine concavo-convex structure on the surface, and preferably 5 to 25 weight part. An anti glare layer may serve as a diffusion layer (viewing angle expanding function etc.) for diffusing transmitting light through the polarizing plate and expanding a viewing angle etc.

In addition, the above-mentioned antireflection layer, sticking prevention layer, diffusion layer, anti glare layer, etc. may be built in the protective film itself, and also they may be prepared as an optical layer different from the protective layer.

An optical film of the present invention is especially no limitation about the optical layers, which may be used for formation of a liquid crystal display etc., such as a reflector, a transflective plate, a retardation plate (a half wavelength plate and a quarter wavelength plate included), and a viewing angle compensation film, may be used.

Especially preferable polarizing plates are; a reflection type polarizing plate or a transflective type polarizing plate in which a reflector or a transflective reflector is further laminated onto a polarizing plate of the present invention; an elliptically polarizing plate or a circular polarizing plate in which a retardation plate is further laminated onto the polarizing plate; a wide viewing angle polarizing plate in which a viewing angle compensation film is further laminated onto the polarizing plate; or a polarizing plate in which a brightness enhancement film is further laminated onto the polarizing plate.

A reflective layer is prepared on a polarizing plate to give a reflection type polarizing plate, and this type of plate is used for a liquid crystal display in which an incident light from a view side (display side) is reflected to give a display. This type of plate does not require built-in light sources, such as a backlight, but has an advantage that a liquid crystal display may easily be made thinner. A reflection type polarizing plate may be formed using suitable methods, such as a method in which a reflective layer of metal etc. is, if required, attached to one side of a polarizing plate through a transparent protective layer etc.

As an example of a reflection type polarizing plate, a plate may be mentioned on which, if required, a reflective layer is formed using a method of attaching a foil and vapor deposition film of reflective metals, such as aluminum, to one side of a matte treated protective film. Moreover, a different type of plate with a fine concavo-convex structure on the surface obtained by mixing fine particle into the above-mentioned protective film, on which a reflective layer of concavo-convex structure is prepared, may be mentioned. The reflective layer that has the above-mentioned fine concavo-convex structure diffuses incident light by random reflection to prevent directivity and glaring appearance, and has an advantage of controlling unevenness of light and darkness etc. Moreover, the protective film containing the fine particle has an advantage that unevenness of light and darkness may be controlled more effectively, as a result that an incident light and its reflected light that is transmitted through the film are diffused. A reflective layer with fine concavo-convex structure on the surface effected by a surface fine concavo-convex structure of a protective film may be formed by a method of attaching a metal to the surface of a transparent protective layer directly using, for example, suitable methods of a vacuum evaporation method, such as a vacuum deposition method, an ion plating method, and a sputtering method, and a plating method etc.

Instead of a method in which a reflection plate is directly given to the protective film of the above-mentioned polarizing plate, a reflection plate may also be used as a reflective sheet constituted by preparing a reflective layer on the suitable film for the transparent film. In addition, since a reflective layer is usually made of metal, it is desirable that the reflective side is covered with a protective film or a polarizing plate etc. when used, from a viewpoint of preventing deterioration in reflectance by oxidation, of maintaining an initial reflectance for a long period of time and of avoiding preparation of a protective layer separately etc.

In addition, a transflective type polarizing plate may be obtained by preparing the above-mentioned reflective layer as a transflective type reflective layer, such as a half-mirror etc. that reflects and transmits light. A transflective type polarizing plate is usually prepared in the backside of a liquid crystal cell and it may form a liquid crystal display unit of a type in which a picture is displayed by an incident light reflected from a view side (display side) when used in a comparatively well-lighted atmosphere. And this unit displays a picture, in a comparatively dark atmosphere, using embedded type light sources, such as a back light built in backside of a transflective type polarizing plate. That is, the transflective type polarizing plate is useful to obtain of a liquid crystal display of the type that saves energy of light sources, such as a back light, in a well-lighted atmosphere, and can be used with a built-in light source if needed in a comparatively dark atmosphere etc.

The above-mentioned polarizing plate may be used as elliptically polarizing plate or circularly polarizing plate on which the retardation plate is laminated. A description of the above-mentioned elliptically polarizing plate or circularly polarizing plate will be made in the following paragraph. These polarizing plates change linearly polarized light into elliptically polarized light or circularly polarized light, elliptically polarized light or circularly polarized light into linearly polarized light or change the polarization direction of linearly polarization by a function of the retardation plate. As a retardation plate that changes circularly polarized light into linearly polarized light or linearly polarized light into circularly polarized light, what is called a quarter wavelength plate (also called λ/4 plate) is used. Usually, half-wavelength plate (also called λ/2 plate) is used, when changing the polarization direction of linearly polarized light.

Elliptically polarizing plate is effectively used to give a monochrome display without above-mentioned coloring by compensating (preventing) coloring (blue or yellow color) produced by birefringence of a liquid crystal layer of a super twisted nematic (STN) type liquid crystal display. Furthermore, a polarizing plate in which three-dimensional refractive index is controlled may also preferably compensate (prevent) coloring produced when a screen of a liquid crystal display is viewed from an oblique direction. Circularly polarizing plate is effectively used, for example, when adjusting a color tone of a picture of a reflection type liquid crystal display that provides a colored picture, and it also has function of antireflection.

As retardation plates, birefringent films obtained by uniaxially or biaxially stretched polymer materials, oriented films of liquid crystal polymers, oriented layers of liquid crystal polymers currently supported with films may be mentioned. A thickness of the retardation plate is also not especially limited, and it is about 20 to 150 μm in general.

As polymer material, for example, there may be mentioned: polyvinyl alcohols, polyvinyl butyrals, polymethyl vinyl ethers, polyhydroxy ethyl acrylates, hydroxyethyl celluloses, hydroxy propyl celluloses, methyl celluloses, polycarbonates, polyallylates, polysulfones, polyethylene terephthalates, polyethylene naphthalates, polyethersulfones, polyphenylene sulfides, polyphenylene oxides, polyallyl sulfones, polyamides, polyimides, polyolefins, polyvinyl chlorides, cellulose type polymers, and norbornene based resins, or binary or ternary copolymers, graft copolymers, and blend object thereof. These polymer materials are stretched to obtain an oriented object that is stretched film.

As liquid crystalline polymers, for example, various kinds of polymers of principal chain type and side chain type in which conjugated linear atomic groups (mesogens) conferring liquid crystalline orientation are introduced into a principal chain and a side chain of a polymer may be mentioned. As examples of principal chain type liquid crystalline polymers, polymers having a structure where mesogen groups are bonded by spacer parts conferring flexibility, for example, polyester based liquid crystalline polymers having nematic orientation property, discotic polymers, cholesteric polymers, etc. may be mentioned. As examples of side chain type liquid crystalline polymers, polymers having polysiloxanes, polyacrylates, polymethacrylates, or polymalonates as a principal chain skeleton, and having mesogen parts comprising para-substituted cyclic compound units conferring nematic orientation property as side chains via spacer parts comprising conjugated atomic groups may be mentioned. These liquid crystal polymer, for example, is aligned by developing a solution of a liquid crystal polymer on an orientation treated surface where rubbing treatment was performed to a surface of thin films, such as polyimide and polyvinyl alcohol, formed on a glass plate, or where silicon oxide is deposited by an oblique evaporation method, and then by heat-treating.

Retardation plates that have suitable phase difference depending on the purpose of use, such as aiming at compensation of coloring or viewing angle using birefringence, for example, various wavelength plates and liquid crystal layers, may be used. In addition retardation plates in which two or more kinds of retardation plates are laminated together to control optical properties, such as phase difference may be used.

The above-mentioned elliptically polarizing plate and an above-mentioned reflected type elliptically polarizing plate are laminated plate combining suitably a polarizing plate or a reflection type polarizing plate with a retardation plate. This type of elliptically polarizing plate etc. may be manufactured by combining a polarizing plate (reflected type) and a retardation plate, and by laminating them one by one separately in the manufacture process of a liquid crystal display. On the other hand, the polarizing plate in which lamination was beforehand carried out and was obtained as an optical film, such as an elliptically polarizing plate, is excellent in a stable quality, a workability in lamination etc., and has an advantage in improved manufacturing efficiency of a liquid crystal display.

A viewing angle compensation film is a film for extending viewing angle so that a picture may look comparatively clearly, even when it is viewed from an oblique direction not from vertical direction to a screen. As such a viewing angle compensation retardation plate, in addition, a film having birefringence property that is processed by uniaxial stretching or orthogonal biaxial stretching and a bi-directional stretched film as inclined orientation film etc. may be used. As inclined orientation film, for example, a film obtained using a method in which a heat shrinking film is adhered to a polymer film, and then the combined film is heated and stretched or shrinked under a condition of being influenced by a shrinking force, or a film that is oriented in oblique direction may be mentioned. The viewing angle compensation film is suitably combined for the purpose of prevention of coloring caused by change of visible angle based on retardation by liquid crystal cell etc. and of expansion of viewing angle with good visibility.

Besides, a compensation plate in which an optical anisotropy layer consisting of an alignment layer of liquid crystal polymer, especially consisting of an inclined alignment layer of discotic liquid crystal polymer is supported with triacetyl cellulose film may preferably be used from a viewpoint of attaining a wide viewing angle with good visibility.

The polarizing plate with which a polarizing plate and a brightness enhancement film are adhered together is usually used being prepared in a backside of a liquid crystal cell. A brightness enhancement film shows a characteristic that reflects linearly polarized light with a predetermined polarization axis, or circularly polarized light with a predetermined direction, and that transmits other light, when natural light by back lights of a liquid crystal display or by reflection from a back-side etc., comes in. The polarizing plate, which is obtained by laminating a brightness enhancement film to a polarizing plate, thus does not transmit light without the predetermined polarization state and reflects it, while obtaining transmitted light with the predetermined polarization state by accepting a light from light sources, such as a backlight. This polarizing plate makes the light reflected by the brightness enhancement film further reversed through the reflective layer prepared in the backside and forces the light re-enter into the brightness enhancement film, and increases the quantity of the transmitted light through the brightness enhancement film by transmitting a part or all of the light as light with the predetermined polarization state. The polarizing plate simultaneously supplies polarized light that is difficult to be absorbed in a polarizer, and increases the quantity of the light usable for a liquid crystal picture display etc., and as a result luminosity may be improved. That is, in the case where the light enters through a polarizer from backside of a liquid crystal cell by the back light etc. without using a brightness enhancement film, most of the light, with a polarization direction different from the polarization axis of a polarizer, is absorbed by the polarizer, and does not transmit through the polarizer. This means that although influenced with the characteristics of the polarizer used, about 50 percent of light is absorbed by the polarizer, the quantity of the light usable for a liquid crystal picture display etc. decreases so much, and a resulting picture displayed becomes dark. A brightness enhancement film does not enter the light with the polarizing direction absorbed by the polarizer into the polarizer but reflects the light once by the brightness enhancement film, and further makes the light reversed through the reflective layer etc. prepared in the backside to re-enter the light into the brightness enhancement film. By this above-mentioned repeated operation, only when the polarization direction of the light reflected and reversed between the both becomes to have the polarization direction which may pass a polarizer, the brightness enhancement film transmits the light to supply it to the polarizer. As a result, the light from a backlight may be efficiently used for the display of the picture of a liquid crystal display to obtain a bright screen.

A diffusion plate may also be prepared between brightness enhancement film and the above described reflective layer, etc. A polarized light reflected by the brightness enhancement film goes to the above described reflective layer etc., and the diffusion plate installed diffuses passing light uniformly and changes the light state into depolarization at the same time. That is, the diffusion plate returns polarized light to natural light state. Steps are repeated where light, in the unpolarized state, i.e., natural light state, reflects through reflective layer and the like, and again goes into brightness enhancement film through diffusion plate toward reflective layer and the like. Diffusion plate that returns polarized light to the natural light state is installed between brightness enhancement film and the above described reflective layer, and the like, in this way, and thus a uniform and bright screen may be provided while maintaining brightness of display screen, and simultaneously controlling non-uniformity of brightness of the display screen. By preparing such diffusion plate, it is considered that number of repetition times of reflection of a first incident light increases with sufficient degree to provide uniform and bright display screen conjointly with diffusion function of the diffusion plate.

The suitable films are used as the above-mentioned brightness enhancement film. Namely, multilayer thin film of a dielectric substance; a laminated film that has the characteristics of transmitting a linearly polarized light with a predetermined polarizing axis, and of reflecting other light, such as the multilayer laminated film of the thin film having a different refractive-index anisotropy (D-BEF and others manufactured by 3M Co., Ltd.); an aligned film of cholesteric liquid-crystal polymer; a film that has the characteristics of reflecting a circularly polarized light with either left-handed or right-handed rotation and transmitting other light, such as a film on which the aligned cholesteric liquid crystal layer is supported (PCF350 manufactured by NITTO DENKO CORPORATION, Transmax manufactured by Merck Co., Ltd., and others); etc. may be mentioned.

Therefore, in the brightness enhancement film of a type that transmits a linearly polarized light having the above-mentioned predetermined polarization axis, by arranging the polarization axis of the transmitted light and entering the light into a polarizing plate as it is, the absorption loss by the polarizing plate is controlled and the polarized light can be transmitted efficiently. On the other hand, in the brightness enhancement film of a type that transmits a circularly polarized light as a cholesteric liquid-crystal layer, the light may be entered into a polarizer as it is, but it is desirable to enter the light into a polarizer after changing the circularly polarized light to a linearly polarized light through a retardation plate, taking control an absorption loss into consideration. In addition, a circularly polarized light is convertible into a linearly polarized light using a quarter wavelength plate as the retardation plate.

A retardation plate that works as a quarter wavelength plate in a wide wavelength ranges, such as a visible-light band, is obtained by a method in which a retardation layer working as a quarter wavelength plate to a pale color light with a wavelength of 550 nm is laminated with a retardation layer having other retardation characteristics, such as a retardation layer working as a half-wavelength plate. Therefore, the retardation plate located between a polarizing plate and a brightness enhancement film may consist of one or more retardation layers.

In addition, also in a cholesteric liquid-crystal layer, a layer reflecting a circularly polarized light in a wide wavelength ranges, such as a visible-light band, may be obtained by adopting a configuration structure in which two or more layers with different reflective wavelength are laminated together. Thus a transmitted circularly polarized light in a wide wavelength range may be obtained using this type of cholesteric liquid-crystal layer.

Moreover, the polarizing plate may consist of multi-layered film of laminated layers of a polarizing plate and two of more of optical layers as the above-mentioned separated type polarizing plate. Therefore, a polarizing plate may be a reflection type elliptically polarizing plate or a semi-transmission type elliptically polarizing plate, etc. in which the above-mentioned reflection type polarizing plate or a transflective type polarizing plate is combined with above described retardation plate respectively.

Although an optical film with the above described optical layer laminated to the polarizing plate may be formed by a method in which laminating is separately carried out sequentially in manufacturing process of a liquid crystal display etc., an optical film in a form of being laminated beforehand has an outstanding advantage that it has excellent stability in quality and assembly workability, etc., and thus manufacturing processes ability of a liquid crystal display etc. may be raised. Proper adhesion means, such as an adhesive layer, may be used for laminating. On the occasion of adhesion of the above described polarizing plate and other optical films, the optical axis may be set as a suitable configuration angle according to the target retardation characteristics etc.

A method for producing the antistatic optical film and the antistatic pressure-sensitive adhesive optical film according to the present invention will be described hereinafter.

Firstly, rubbing treatment is performed on the surface of the optical film 1 described above. Publicly known methods is employable for the rubbing treatment, and, for example, a method may include a method for rubbing an surface of an optical film by delivering the optical film while rotating a rubbing roll having rubbing cloths (for example, manufactured by Yoshikawa Processing Co. Ltd., Y-19-R) wound around on a roll, such as made of rayon, cotton, or nylon. The depressed portion (pushing depth) formed by the rubbing treatment preferably has a depth of 0.2 to 1.0 mm, and more preferably 0.2 to 0.5 mm. In order to attain the depth of the depressed portion in the range described above, it is preferred to use a rubbing cloth having a filament density of 24000 to 32000/$cm^2$. The depth of the depressed portion less than 0.2 mm tends to reduce the alignment of the conductive polymer or the binder component. On the other hand, the depth of the depressed portion more than 1.0 mm disadvantageously generates noticeable apparent defects. The number of rotations of the rubbing roll is preferably 500 to 2000 rpm, and more preferably 1000 to 1700 rpm. The number of rotations less than 500 rpm tends to make difficult operation of the uniform rubbing treatment to the optical film surface, and on the other hand, the number of rotation more than 2000 rpm tends to easily give defects on the optical film surface. The traveling rate of the optical film is preferably 3 to 10 m/min, and more preferably 5 to 8 m/min. The traveling rate less than 3 m/min tends to easily form appearance defects, and On the other hand, the traveling rate exceeding 10 m/min tends to reduce the alignment of the conductive polymer or the binder component.

Furthermore, in use of an optical film having optical anisotropy of the polarizing plate, etc., the rubbing treatment is preferably performed at a rubbing angle of ±10° C. or less with respect to a slow axis, more preferably ±5° C. of less, and especially preferably 0° C.

Subsequently, an antistatic layer 2 is formed using an application liquid containing a conductive polymer on a surface of the optical film on which rubbing treatment is performed. The solid concentration of the application liquid is preferably adjusted to approximately 0.5 to 5% by weight. In detail, the application liquid is applied on the optical film using coating methods such as roll coating methods, such as a reverse coating and a gravure coating; a spin coating method; a screen coating method; a fountain coating method; a dipping method; a spray method, etc., and then dried to form an antistatic layer.

Here, the antistatic layer may be formed on the surface of the optical film by the same methods described above without rubbing treatment on the optical film, and subsequently, the rubbing treatment may be performed by the same method described above on the formed antistatic layer surface.

The thickness of the antistatic layer is preferably 5 to 1000 nm. In consideration of optical property deterioration, the thickness of the antistatic layer is usually 5000 nm or less. Thicker antistatic layers may easily cause possible breakage within the antistatic layer due to insufficient strength of the antistatic layer, and may not provide sufficient adhesion. The thickness of the antistatic agent is 500 nm or less, preferably 300 nm or less, and more preferably 200 nm or less. In consideration of guarantee of adhesion, and suppression of peeling electrification, the thickness is 5 nm or more, and preferably 10 nm or more. On the other hand, the thicker antistatic layer gives the more preferable suppression effect of peeling electrification, but the thickness exceeding 200 nm can only give the same or less in suppression effect of peeling electrification. In consideration of such a point, the thickness is 5 to 500 nm, preferably 10 to 300 nm, and more preferably 10 to 200 nm.

In formation of the antistatic layer 2, an activation treatment may be performed with respect to the optical film 1. As the activation treatment, various methods, for example, corona treatment, low-pressure UV treatment, plasma treatment, etc., are employable. When using an aqueous solution containing an electric conductive polymer as an antistatic agent, the activation treatment is effective, and can suppress repelling of the aqueous solution in application. The activation treatment is especially effective, when the optical film 1 is of polyolefin-based resin and norbornene-based resin.

Formation of the pressure-sensitive adhesive layer 3 is performed by lamination onto the above-mentioned antistatic layer 2. Formation methods are not especially limited, and there may be adopted: a method in which a pressure-sensitive adhesive solution is applied onto an antistatic layer, and then is dried; and a method of transfer using a releasing sheet having a pressure-sensitive adhesive layer formed thereon etc. A thickness of the pressure-sensitive adhesive layer is not especially limited; it is preferably about 10 to 40 µm.

As components of the releasing sheet, there may be mentioned suitable sheeted materials: papers; synthetic resin films, such as polyethylenes, polypropylenes, and polyethylene terephthalates; rubber sheets; papers; cloths; nonwoven fabrics; nets; foamed sheets; metallic foils; and laminated materials of the above-mentioned materials, etc. In order to increase releasability from the pressure-sensitive adhesive layer 3, releasing treatment giving low adhesive properties, such as a siliconization, a long chain alkyl treatment, and a florine treatment, may be performed to a surface of the releasing sheet if needed.

In addition, in the present invention, ultraviolet absorbing property may be given to the above-mentioned each layer, such as antistatic pressure-sensitive adhesive optical film, an optical film etc. and an adhesive layer, using a method of adding UV absorbents, such as salicylic acid ester type compounds, benzophenol type compounds, benzotriazol type compounds, cyano acrylate type compounds, and nickel complex salt type compounds.

An antistatic pressure-sensitive adhesive optical film of the present invention may be preferably used for manufacturing various equipment, such as liquid crystal display, etc. Assembling of a liquid crystal display may be carried out according to conventional methods. That is, a liquid crystal display is generally manufactured by suitably assembling several parts such as a liquid crystal cell, optical films and, if necessary, lighting system, and by incorporating driving circuit. In the present invention, except that the optical film by the present invention is used, there is especially no limitation to use any conventional methods. Also any liquid crystal cell of arbitrary type, such as TN type, and STN type, π type may be used.

Suitable liquid crystal displays, such as liquid crystal display with which the above-mentioned antistatic pressure-sensitive adhesive optical film has been located at one side or both sides of the liquid crystal cell, and with which a backlight or a reflector is used for a lighting system may be manufactured. In this case, the antistatic pressure-sensitive adhesive optical film by the present invention may be installed in one side or both sides of the liquid crystal cell. When installing the optical films in both sides, they may be of the same type or of different type. Furthermore, in assembling a liquid crystal display, suitable parts, such as diffusion plate, anti-glare layer, antireflection film, protective plate, prism array, lens array sheet, optical diffusion plate, and backlight, may be installed in suitable position in one layer or two or more layers.

Subsequently, organic electro luminescence equipment (organic EL display) will be explained. Generally, in organic EL display, a transparent electrode, an organic emitting layer and a metal electrode are laminated on a transparent substrate in an order configuring an illuminant (organic electro luminescence illuminant). Here, an organic emitting layer is a laminated material of various organic thin films, and much compositions with various combination are known, for example, a laminated material of hole injection layer comprising triphenylamine derivatives etc., an emitting layer comprising fluorescent organic solids, such as anthracene; a laminated material of electronic injection layer comprising such an emitting layer and perylene derivatives, etc.; laminated material of these hole injection layers, emitting layer, and electronic injection layer etc.

An organic EL display emits light based on a principle that positive hole and electron are injected into an organic emitting layer by impressing voltage between a transparent electrode and a metal electrode, the energy produced by recombination of these positive holes and electrons excites fluorescent substance, and subsequently light is emitted when excited fluorescent substance returns to ground state. A mechanism called recombination which takes place in an intermediate process is the same as a mechanism in common diodes, and, as is expected, there is a strong non-linear relationship between electric current and luminescence strength accompanied by rectification nature to applied voltage.

In an organic EL display, in order to take out luminescence in an organic emitting layer, at least one electrode must be transparent. The transparent electrode usually formed with transparent electric conductor, such as indium tin oxide (ITO), is used as an anode. On the other hand, in order to make electronic injection easier and to increase luminescence efficiency, it is important that a substance with small work function is used for cathode, and metal electrodes, such as Mg—Ag and Al—Li, are usually used.

In organic EL display of such a configuration, a very thin film about 10 nm forms an organic emitting layer in thickness. For this reason, light is transmitted nearly completely through organic emitting layer as through transparent electrode. Consequently, since the light that enters, when light is not emitted, as incident light from a surface of a transparent substrate and is transmitted through a transparent electrode and an organic emitting layer and then is reflected by a metal electrode, appears in front surface side of the transparent substrate again, a display side of the organic EL display looks like mirror if viewed from outside.

In an organic EL display containing an organic electro luminescence illuminant equipped with a transparent electrode on a surface side of an organic emitting layer that emits light by impression of voltage, and at the same time equipped with a metal electrode on a back side of organic emitting layer, a retardation plate may be installed between these transparent electrodes and a polarizing plate, while preparing the polarizing plate on the surface side of the transparent electrode.

Since the retardation plate and the polarizing plate have function polarizing the light that has entered as incident light from outside and has been reflected by the metal electrode, they have an effect of making the mirror surface of metal electrode not visible from outside by the polarization action. If a retardation plate is configured with a quarter wavelength plate and the angle between the two polarization directions of the polarizing plate and the retardation plate is adjusted to π/4, the mirror surface of the metal electrode may be completely covered.

This means that only linearly polarized light component of the external light that enters as incident light into this organic EL display is transmitted with the work of polarizing plate. This linearly polarized light generally gives an elliptically polarized light by the retardation plate, and especially the retardation plate is a quarter wavelength plate, and moreover when the angle between the two polarization directions of the polarizing plate and the retardation plate is adjusted to π/4, it gives a circularly polarized light.

This circularly polarized light is transmitted through the transparent substrate, the transparent electrode and the organic thin film, and is reflected by the metal electrode, and then is transmitted through the organic thin film, the transparent electrode and the transparent substrate again, and is turned into a linearly polarized light again with the retardation plate. And since this linearly polarized light lies at right angles to the polarization direction of the polarizing plate, it cannot be transmitted through the polarizing plate. As the result, mirror surface of the metal electrode may be completely covered.

EXAMPLE

The present invention will be described specifically with reference to examples hereinafter, but the present invention is not limited by these examples. Both of parts and % in each example are based on weight.

Example 1

Production of Optical Film

A polyvinyl alcohol film having a thickness of 80 μm was stretched 5 times in an iodine aqueous solution at 40° C., and subsequently was dried for 4 minutes at 50° C. to obtain a polarizer. A triacetyl cellulose film was adhered on both sides of this polarizer using a polyvinyl alcohol-based adhesive to obtain a polarizing plate. A rubbing treatment was performed to one side of the polarizing plate using a rubbing roll having a rubbing cloth made of rayon (made by Yoshikawa Processing Co. Ltd.) wound around a roll, under conditions of a rubbing angle of 0° C. to a slow axis of the polarizing plate, a pushing depth of 0.2 mm and 1500 rpm of number of rotation of the roll, and a film traveling rate of 8 m/min.

Formation of Antistatic Layer

An aqueous solution (manufactured by Nagase ChemteX Corporation, Denatron P-502RG, 0.8% of solid concentration) containing a water soluble polythiophene-based conductive polymer was applied to a rubbing treated surface of the above-described polarizing plate so as to have a thickness of 50 nm after drying, and was dried for 2 minutes at 80° C. to form an antistatic layer.

Formation of Pressure-Sensitive Adhesive Layer

An amount of 95 parts of butyl acrylate, 5 parts of acrylic acid, 0.2 parts of benzoyl peroxide were dissolved in 300 parts of toluene, and the reaction was performed at about 60° C. under agitation for 6 hours to obtain a solution (25% of solid content) containing an acryl-based polymer having a weight average molecular weight of 2 millions. As an isocyanate-based polyfunctional compound, 0.5 part of Coronate L manufactured by NIPPON POLYURETHANE INDUSTRY CO., LTD., was added with respect to 100 parts of a polymer solid content of the above-described acryl-based polymer solution to obtain a pressure-sensitive adhesive solution. The pressure-sensitive adhesive solution concerned was applied, using a reverse roll coating method, to a releasing film (polyethylene terephthalate base material: DIAFOIL MRF38, manufactured by MITSUBISHI POLYESTER FILM CORPORATION) so as to have a thickness after drying of 25 μm. Subsequently, a releasing film was further applied, and dried in a hot air circulating oven to form a pressure-sensitive adhesive layer.

Production of Antistatic Pressure-Sensitive Adhesive Optical Film

The releasing film having a pressure-sensitive adhesive layer formed thereon was attached on the antistatic layer of the above-described antistatic polarizing plate to obtain an antistatic pressure-sensitive adhesive polarizing plate.

Example 2

Production of Optical Film

A polyvinyl alcohol film having a thickness of 80 μm was stretched 5 times in an iodine aqueous solution at 40° C., and subsequently was dried for 4 minutes at 50° C. to obtain a polarizer. A triacetyl cellulose film was adhered on both sides of this polarizer using a polyvinyl alcohol-based adhesive to obtain a polarizing plate.

Formation of Antistatic Layer

An aqueous solution (manufactured by Nagase ChemteX Corporation, Denatron P-502RG, solid concentration of 0.8%) containing a water soluble polythiophene-based conductive polymer was applied to one surface of the above-described polarizing plate so as to have a thickness of 50 nm after drying, and was dried for 2 minutes at 80° C. to form an antistatic layer. Subsequently, rubbing treatment was performed on a surface of the antistatic layer using a rubbing roll having a rubbing cloth made of rayon (made by Yoshikawa Processing Co. Ltd.) wound around a roll, under conditions of a pushing depth of 0.2 mm and 1500 rpm of number of rotations of the roll, and a film traveling rate of 8 m/min.

Formation of Pressure-Sensitive Adhesive Layer

A releasing film with a pressure-sensitive adhesive layer was produced by the same method as in Example 1.

Production of Antistatic Pressure-Sensitive Adhesive Optical Film

The releasing film having a pressure-sensitive adhesive layer formed thereon was attached on the antistatic layer of the above-described antistatic polarizing plate to obtain an antistatic pressure-sensitive adhesive polarizing plate.

Comparative Example 1

A pressure-sensitive adhesive polarizing plate was produced by the same method as in Example 1, except for not having formed an antistatic layer in Example 1.

Comparative Example 2

An antistatic pressure-sensitive adhesive polarizing plate was produced by the same method as in Example 1, except for not having performed rubbing treatment to a polarizing plate in formation of the optical film of Example 1.

Reference Example 1

An antistatic pressure-sensitive adhesive polarizing plate was produced by the same method as in Example 1, except for having changed a rubbing angle to a slow axis of a polarizing plate into 20° C. from 0° C. in formation of the optical film of Example 1.

The antistatic pressure-sensitive adhesive optical films obtained by the above-described Examples and Comparative examples were evaluated for following items. Table 1 shows evaluation results.

Light Transmittance

The produced antistatic pressure-sensitive adhesive optical film or the pressure-sensitive adhesive optical film was punched into a size of 25 mm×50 mm using a Thomson stamping die. This was adhered to a glass surface to obtain a sample. The sample was measured for light transmittance using an integrating sphere type spectral transmittance measuring instrument (made by Murakami Color Research Laboratory, DOT-3).

Antistatic Effect

The produced antistatic pressure-sensitive adhesive optical film or the pressure-sensitive adhesive optical film was cut into a size of 100 mm×100 mm and was adhered on a liquid crystal panel. This panel was disposed on a backlight with a luminance of 10000 cds, and static electricity of 5 kV was generated using an ESD (product made by SANKI Co., Ltd., ESD-8012A) as a static electricity generator to induce alignment disorder of the liquid crystal. The recovery period of time (second) of display defect by the alignment defect was measured for using an instant multi-photometry detector (made by OTSUKA ELECTRONICS CO., LTD., MCPD-3000).

Surface Resistance Value

The surface resistance value (Ω/square) of the antistatic layer was measured for with an applied voltage of 500V using a surface resistance measuring instrument (manufactured by Mitsubishi Chemical Corporation, Hiresta MCP-HT450).

TABLE 1

|  | Light transmittance (%) | Display defect recovery time (s) | Surface resistance value (Ω/square) |
|---|---|---|---|
| Example 1 | 42.9 | 1> | $5.4 \times 10^8$ |
| Example 2 | 42.6 | 1> | $6.3 \times 10^8$ |
| Comparative Example 1 | 43.0 | >600 | $>1.0 \times 10^{13}$ |
| Comparative Example 2 | 41.5 | 1> | $7.5 \times 10^8$ |
| Reference Example 1 | 42.0 | 1> | $5.9 \times 10^8$ |

What is claimed is:

1. An antistatic optical film having an antistatic layer laminated on and in direct contact with at least one side of an optical film, wherein rubbing treatment is performed on a surface of the optical film on which the antistatic layer is laminated, and a conductive polymer in the antistatic layer is aligned,
    wherein the optical film is selected from the group consisting of a polarizing plate, a retardation plate, a viewing angle compensation film, a brightness enhancement film, and a laminate thereof, provided that the optical film does not comprise a liquid crystal polymer in a liquid crystalline state at room temperature, and
    wherein the optical film has a depressed portion formed by said rubbing treatment.

2. The antistatic optical film according to claim 1, wherein the optical film has optical anisotropy, and the rubbing treatment is performed at a rubbing angle of ±10° or less with respect to a slow axis.

3. The antistatic optical film according to claim 1, wherein the conductive polymer is water soluble or water dispersible.

4. The antistatic optical film according to claim 3, wherein the water soluble or water dispersible conductive polymer is a polythiophene-based conductive polymer.

5. The antistatic optical film according to claim 1, wherein the antistatic layer further comprises a binder component.

6. The antistatic optical film according to claim 5, wherein the binder component is at least one kind selected from the group consisting of polyurethane-based resins, polyester-based resins, and acryl-based resins.

7. An antistatic pressure-sensitive adhesive optical film having a pressure-sensitive adhesive layer laminated on the antistatic layer of the antistatic optical film of claim 1.

8. The antistatic pressure-sensitive adhesive optical film according to claim 7, wherein the pressure-sensitive adhesive layer is formed of an acryl-based pressure-sensitive adhesive.

9. A method for producing the antistatic pressure-sensitive adhesive optical film according to claim 7, comprising the steps of:
performing rubbing treatment on a surface of the optical film on which an antistatic layer is formed;
applying an application liquid containing a conductive polymer to the surface of the optical film on which the rubbing treatment is performed and drying the optical film to form an antistatic layer; and
forming a pressure-sensitive adhesive layer on the antistatic layer.

10. A method for producing the antistatic optical film according to claim 1, comprising the steps of:
performing rubbing treatment on a surface of the optical film on which an antistatic layer is formed; and
applying an application liquid containing a conductive polymer to the surface of the optical film on which the rubbing treatment is performed and drying the optical film to form an antistatic layer.

11. An image viewing display using the antistatic optical film of claim 1.

12. An antistatic optical film having an antistatic layer laminated on and in direct contact with at least one side of an optical film, wherein a rubbing treatment is performed on a surface of the antistatic layer, and a conductive polymer in the antistatic layer is in an aligned state,
wherein the optical film is selected from the group consisting of a polarizing plate, a retardation plate, a viewing angle compensation film, a brightness enhancement film, and a laminate thereof, provided that the optical film does not comprise a liquid crystal polymer in a liquid crystalline state at room temperature, and
wherein the antistatic layer has a depressed portion formed by said rubbing treatment.

13. A method for producing the antistatic optical film according to claim 12, comprising the steps of:
applying an application liquid containing a conductive polymer on at least to one side of the optical film, and drying the optical film to form an antistatic layer; and
performing rubbing treatment on a surface of the antistatic layer.

14. The antistatic optical film according to claim 12, wherein the conductive polymer is water soluble or water dispersible.

15. The antistatic optical film according to claim 12, wherein the antistatic layer further comprises a binder component.

16. An antistatic pressure-sensitive adhesive optical film having a pressure-sensitive adhesive layer laminated on the antistatic layer of the antistatic optical film of claim 12.

17. A method for producing the antistatic pressure-sensitive adhesive optical film according to claim 16, comprising the steps of:
applying an application liquid containing a conductive polymer to at least one side of the optical film, and drying the optical film to form an antistatic layer;
performing rubbing treatment on a surface of the antistatic layer; and
forming a pressure-sensitive adhesive layer on the antistatic layer on which the rubbing treatment is performed.

18. An image viewing display using the antistatic optical film of claim 12.

19. The antistatic optical film according to claim 12, wherein the depressed portion of said optical film formed by said rubbing treatment has a depth of 0.2-1.0 mm.

20. An antistatic optical film comprising:
(a) an optical film; and
(b) an antistatic layer comprising a conductive polymer laminated on and in direct contact with the optical film, wherein the conductive polymer in the antistatic layer is aligned;
wherein a rubbing treatment is performed on a surface of either: (i) the optical film on which the antistatic layer is laminated; or (ii) the antistatic layer; provided that the optical film does not comprise a liquid crystal polymer in a liquid crystalline state at room temperature.

* * * * *